United States Patent [19]
Keshtbod

[11] Patent Number: 6,084,483
[45] Date of Patent: Jul. 4, 2000

[54] INTERNAL OSCILLATOR CIRCUIT INCLUDING A RING OSCILLATOR CONTROLLED BY A VOLTAGE REGULATOR CIRCUIT

[75] Inventor: Parviz Keshtbod, Los Altos Hills, Calif.

[73] Assignee: Lexar Media, Inc., Fremont, Calif.

[21] Appl. No.: 09/265,192

[22] Filed: Mar. 10, 1999

[51] Int. Cl.[7] .................................................. H03B 5/04
[52] U.S. Cl. ...................... 331/57; 331/176; 331/177 R; 331/186
[58] Field of Search ......................... 331/57, 176, 177 R, 331/186

[56] References Cited

U.S. PATENT DOCUMENTS 5,072,197  12/1991  Anderson .................................. 331/57
5,847,616  12/1998  Ng et al. ................................... 331/57

FOREIGN PATENT DOCUMENTS 60053320  3/1985  Japan .

*Primary Examiner*—Siegfried H. Grimm
*Attorney, Agent, or Firm*—Law Office of Imam

[57] ABSTRACT

An oscillator circuit residing internally to a semiconductor device for generating a clock signal for use by digital circuits. The oscillator circuit includes a voltage regulator circuit responsive to frequency selection signals for selecting a predetermined frequency and a supply voltage. The voltage regulator circuit is operative to generate a voltage reference signal having a voltage level being adjusted to compensate for variations due to temperature, process and supply voltage variations. The oscillator circuit further includes a ring oscillator circuit responsive to the voltage reference signal for generating a clock out signal having a particular frequency based upon the voltage level of the voltage reference signal. Wherein the frequency of the clock out signal remains substantially constant despite temperature, process and supply voltage variations in the semiconductor circuit.

12 Claims, 10 Drawing Sheets

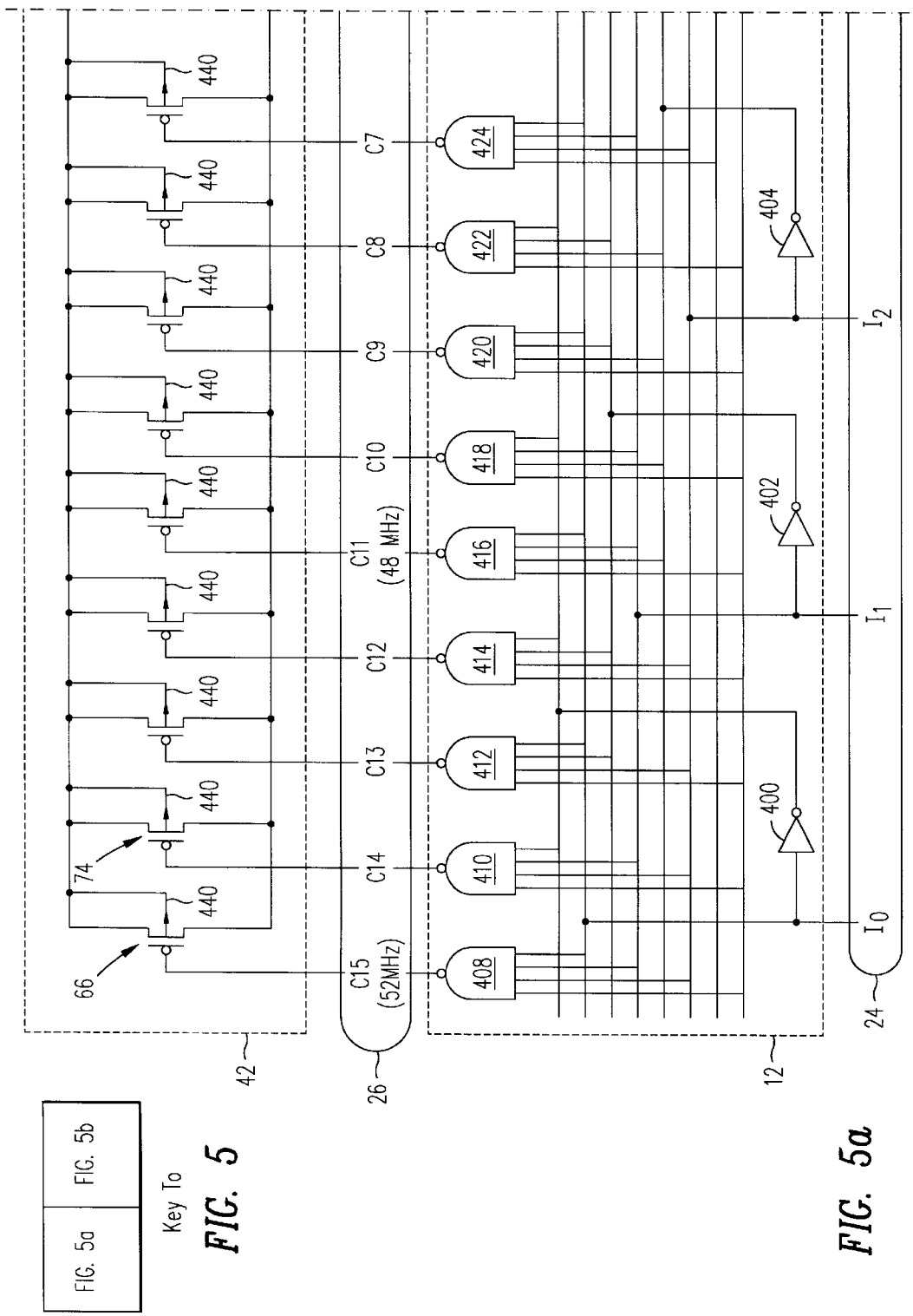

INTERNAL OSCILLATOR CIRCUIT INCLUDING A RING OSCILLATOR CONTROLLED BY A VOLTAGE REGULATOR CIRCUIT

BACKGROUND OF THE INVENTION

1. Field of the Invention

The present invention relates generally to an oscillator for generating signals having various frequencies for use by digital circuits and more particularly to an oscillator located internally as part of a semiconductor device for generating signals of various frequencies for use by remaining circuits of the semiconductor device.

2. Description of the Prior Art

Oscillators are circuits that generate signal(s) having a given frequency for use generally by digital circuits and systems. These generated signals may be system clocks employed by digital circuits for causing the development of other signals and for use in causing synchronization and/or alignment of various signals with respect to other signals and for other like usages. Currently, for example, oscillators generate a system clock using either a crystal oscillator or a resistor-capacitor (RC) relaxation oscillator as a reference.

In crystal oscillators, a quartz crystal device (crystals are cleaved from natural substances that are used in such applications) is utilized as a reference for generating a signal having a given frequency (or oscillations). This signal is buffered prior to being used as a system clock. Use of a crystal causes the frequency of the clock to be constant. This is important because system clock signals, in general, are expected to be "clean" thereby ensuring accurate results when used by various circuits to generate other digital signals. In essence, a system clock signal is used to direct traffic in a synchronized fashion in a circuit or a device. This is in addition to generating other types of digital signals as just mentioned.

However, due to a multitude of reasons, crystals are relatively expensive in addition to being bulky in size and are thus undesirable. Furthermore, a crystal device commonly resides on the outside of, for example, a semiconductor device thereby increasing the size of an electronic board, card or system on which the semiconductor device resides. In this connection, a crystal device, being located externally to a semiconductor device, adds to the complexity of laying out the board (designing where the signals on the board should be routed) on which the crystal device resides. These issues ultimately cause the costs associated with the manufacturing of the board, card or system, which includes the crystal to increase. Moreover, crystal oscillators are difficult to power down, in part, because they require several milliseconds of oscillation frequency prior to stabilization of the frequency. On the other hand, if they are left running, they continue to burn power thereby adding to power consumption.

In an effort to reduce power consumption when using crystal oscillators, designers (or users of crystal oscillators) employ crystal oscillators having much lower frequencies than that which is desired. For instance, frequency that is generated by a crystal oscillator can be on the order of 50 to 200 times less than the desired frequency. The ultimate desired frequency is synthesized using the crystal-generated frequency as reference. Synthesizing requires complicated design and circuitry. Additionally, the desired frequency is fixed and difficult to tune (or adjust) to other frequencies that may actually be more desirable.

The RC relaxation oscillator includes an RC circuit for generating a sawtooth-shaped oscillation. This is employed as the basis for synthesis to obtain the desired frequency. This type of oscillator is similar in operation to crystal oscillators, with the exception that RC oscillators are generally less expensive and less bulky in size than crystal oscillators.

However, while the frequency generated by the RC oscillator can be adjusted by changing the value of the resistor or the capacitor, which are an integral part of the oscillator, one of the drawbacks of this type of oscillator is that it is not as accurate as the crystal oscillator. In fact, variations in temperature, process and supply voltage affect the frequency of oscillation more than that which is desired or may be tolerated at times. Further drawbacks to using an RC oscillator include taking several milliseconds for the synthesizer to reach the desired frequency after the oscillator is activated (this can be reduced by varying the design of the oscillator but any such change to a design is time-consuming and cumbersome). Additionally, this type of oscillator resides on the outside of a semiconductor device.

Therefore, the need arises for an oscillator circuit that resides internally to a semiconductor device, causes generation of signal(s) having accurate frequencies for use by digital signals and circuits, and prevents changes to the frequency of the generated signal that may be due to: variations in the process employed for manufacturing the semiconductor device; temperature variations; or power supply voltage variations.

SUMMARY OF THE INVENTION

Briefly, a preferred embodiment in accordance with the present invention includes an oscillator circuit residing internally to a semiconductor device for generating a clock signal for use by digital circuits. The oscillator circuit including a voltage regulator circuit responsive to frequency selection signals having a predetermined frequency and a supply voltage, the voltage regulator circuit being operative to generate a voltage reference signal having a voltage level being adjusted to compensate for variations due to temperature, process and for supply voltage variations, the oscillator circuit further including a ring oscillator circuit responsive to the voltage reference signal for generating a clock out signal having a particular frequency based upon the voltage level of the voltage reference signal, the voltage level of the voltage reference signal, wherein the frequency of the clock out signal remains substantially constant despite temperature, process and supply voltage variations in the semiconductor circuit.

The foregoing and other objects, features and advantages of the invention will be apparent from the following detailed description of the preferred embodiments which made reference to the several figures of the drawing.

IN THE DRAWINGS

Figure 1:
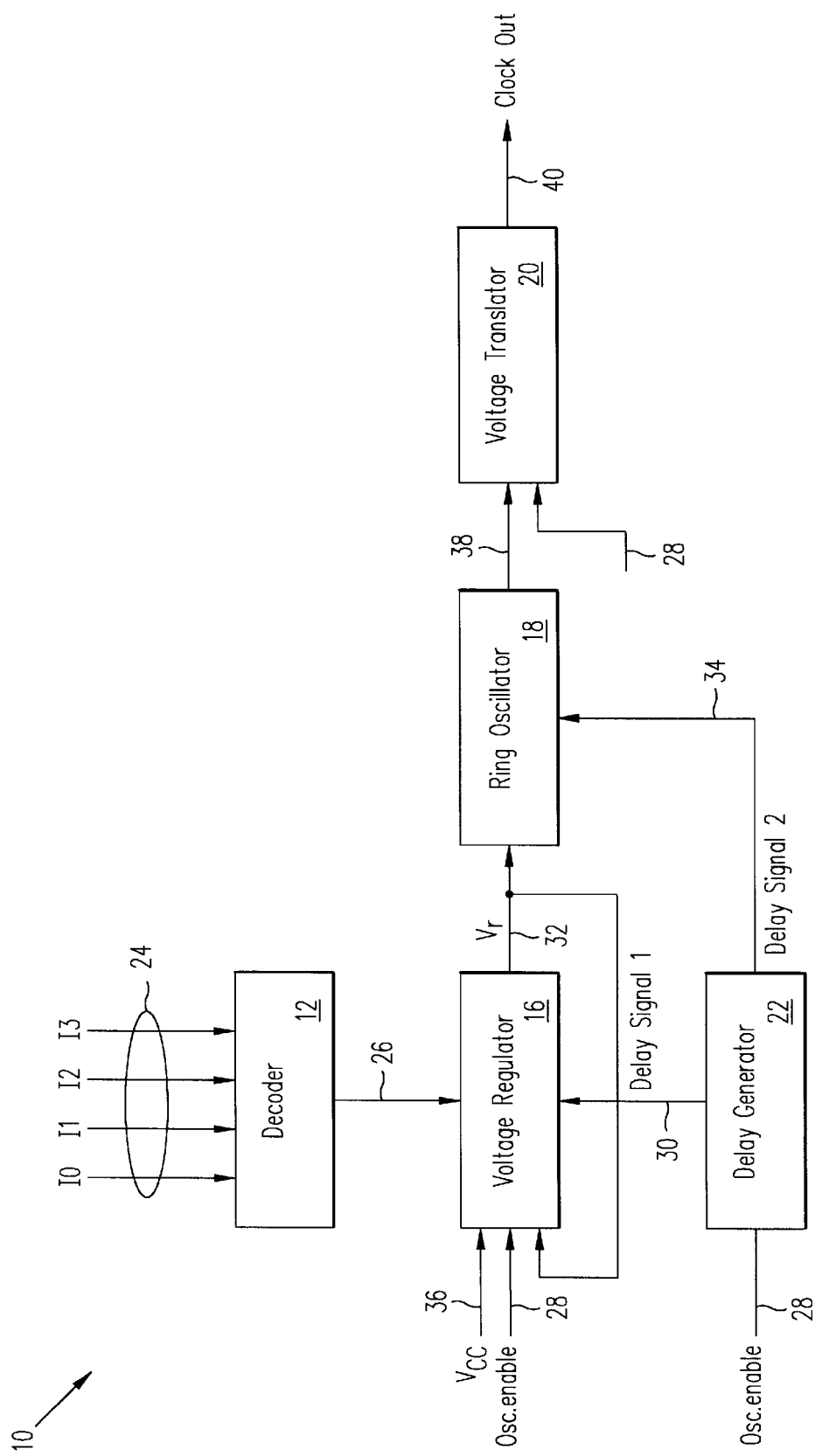
FIG. 1 illustrates a high-level block diagram of an internal oscillator circuit 10 in accordance with an embodiment of the present invention.
Figure 3:
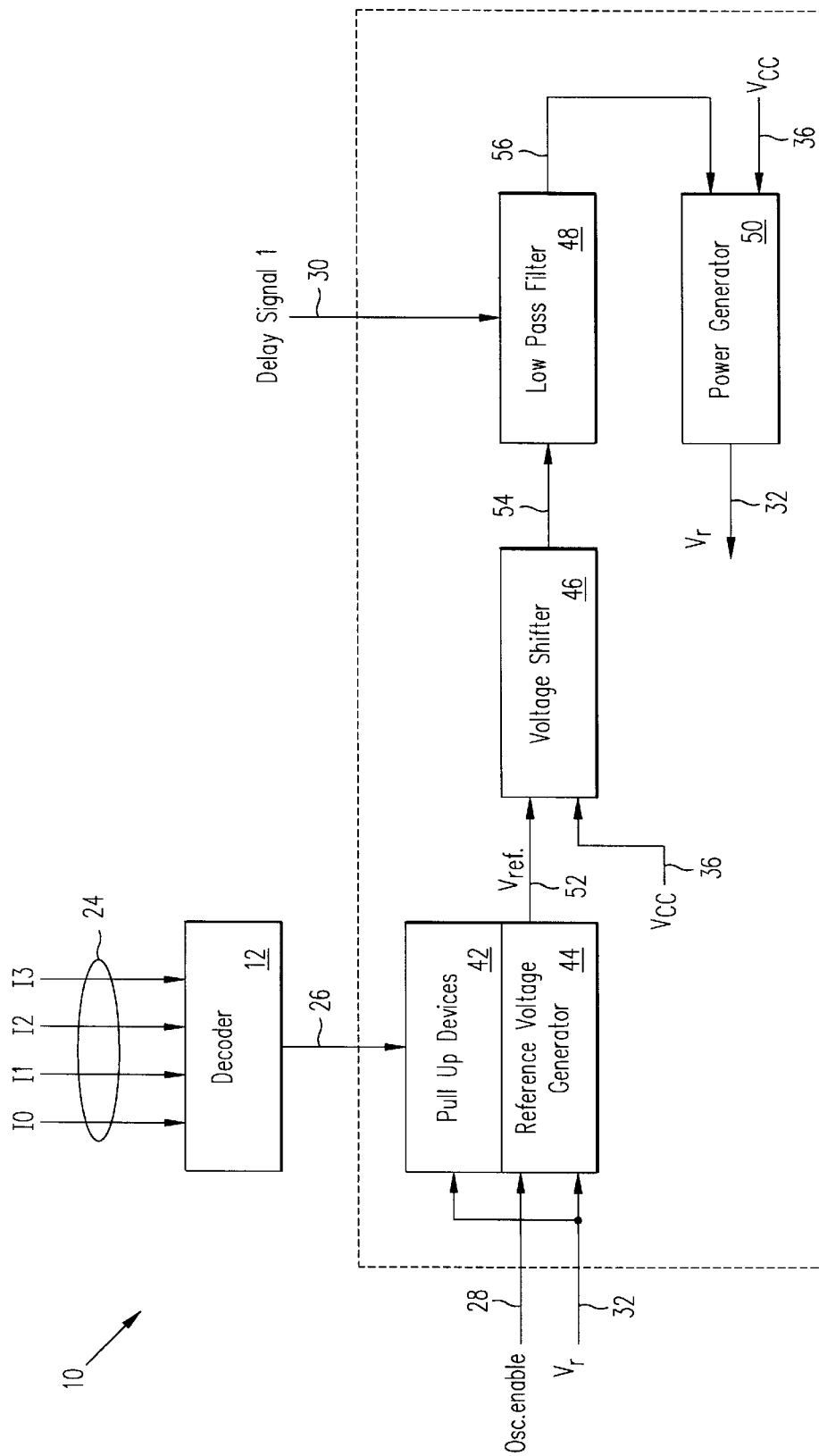
FIG. 3 shows a more detailed block diagram of the voltage regulator circuit 16 of FIG. 1.
Figure 4A:
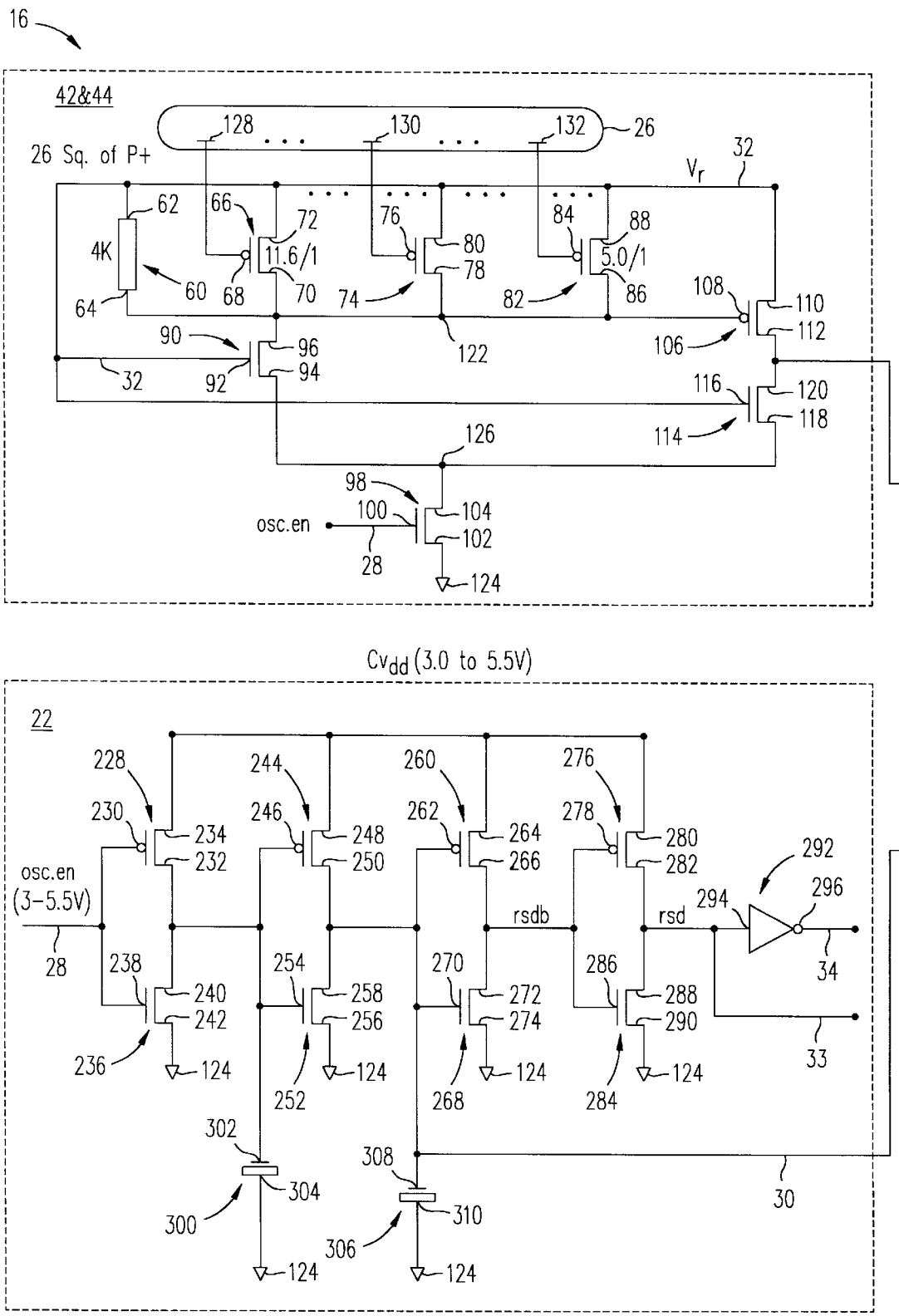
Figures 4, 4B:
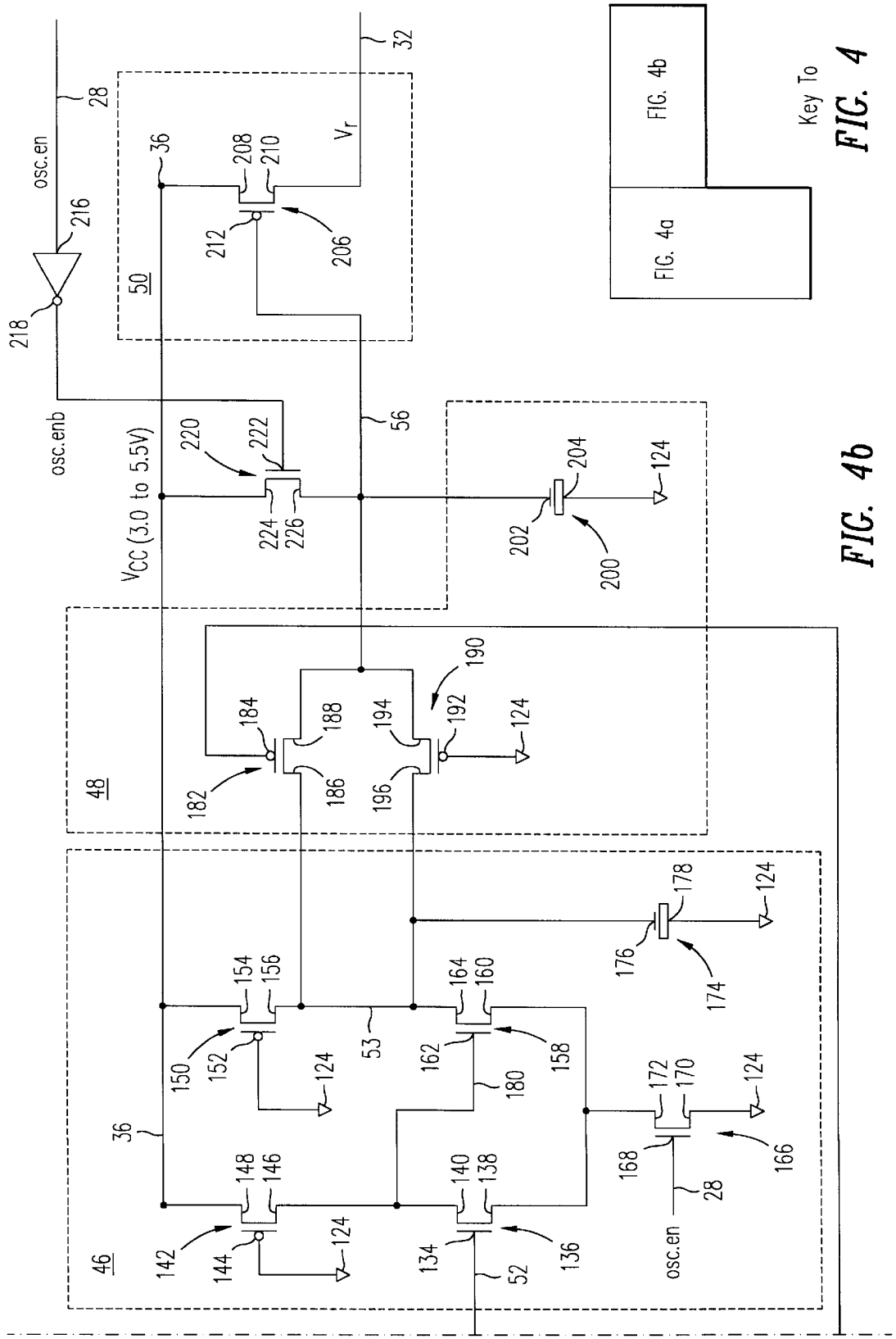

FIG. 4 shows transistor-level details of the voltage regulator circuit 16 of FIGS. 1 and 3 and the delay generator circuit 22 of FIG. 1.

Figure 5B:
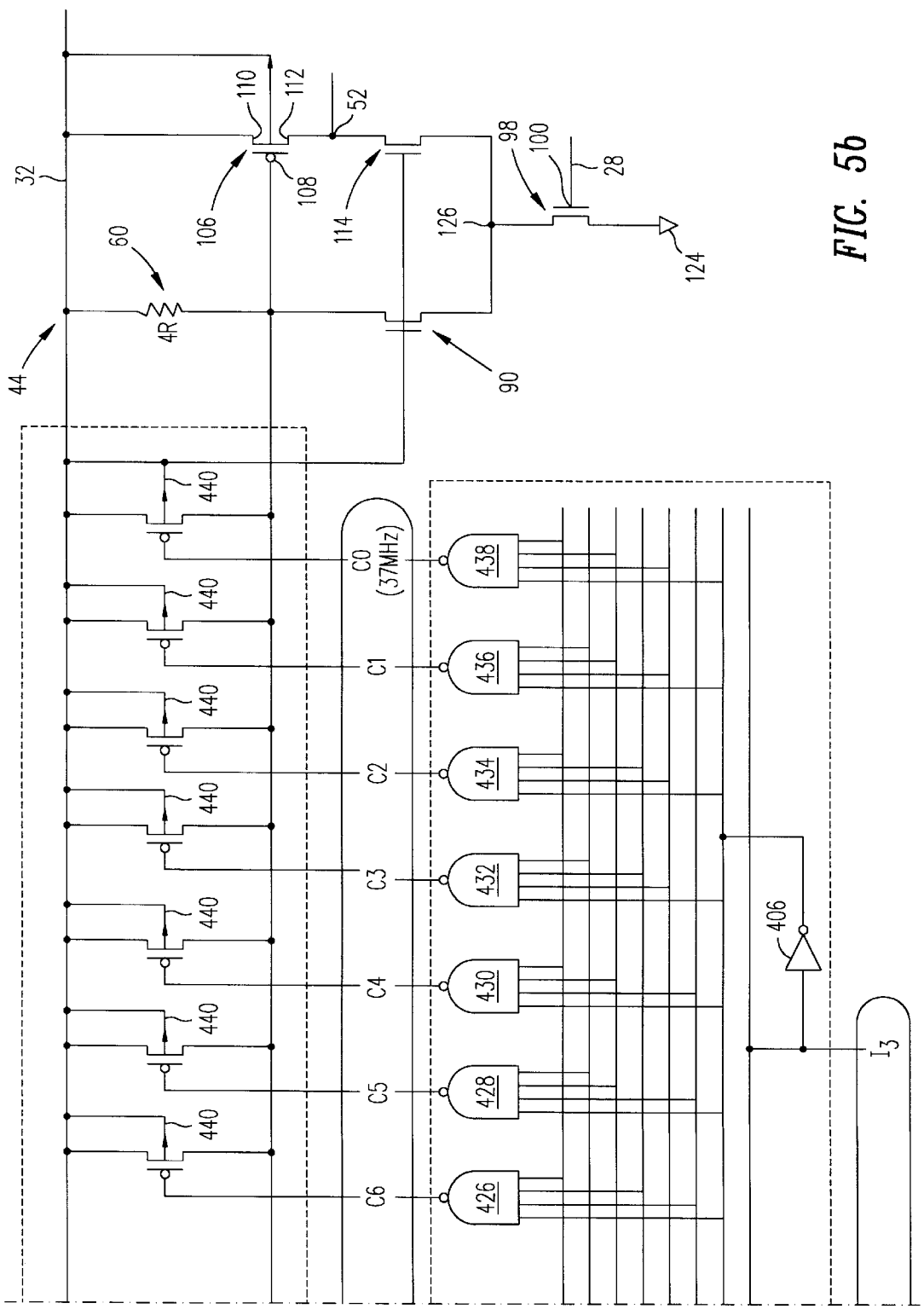

FIG. 5 shows details of the circuitry included in the pull-up devices 42.

Figure 6:
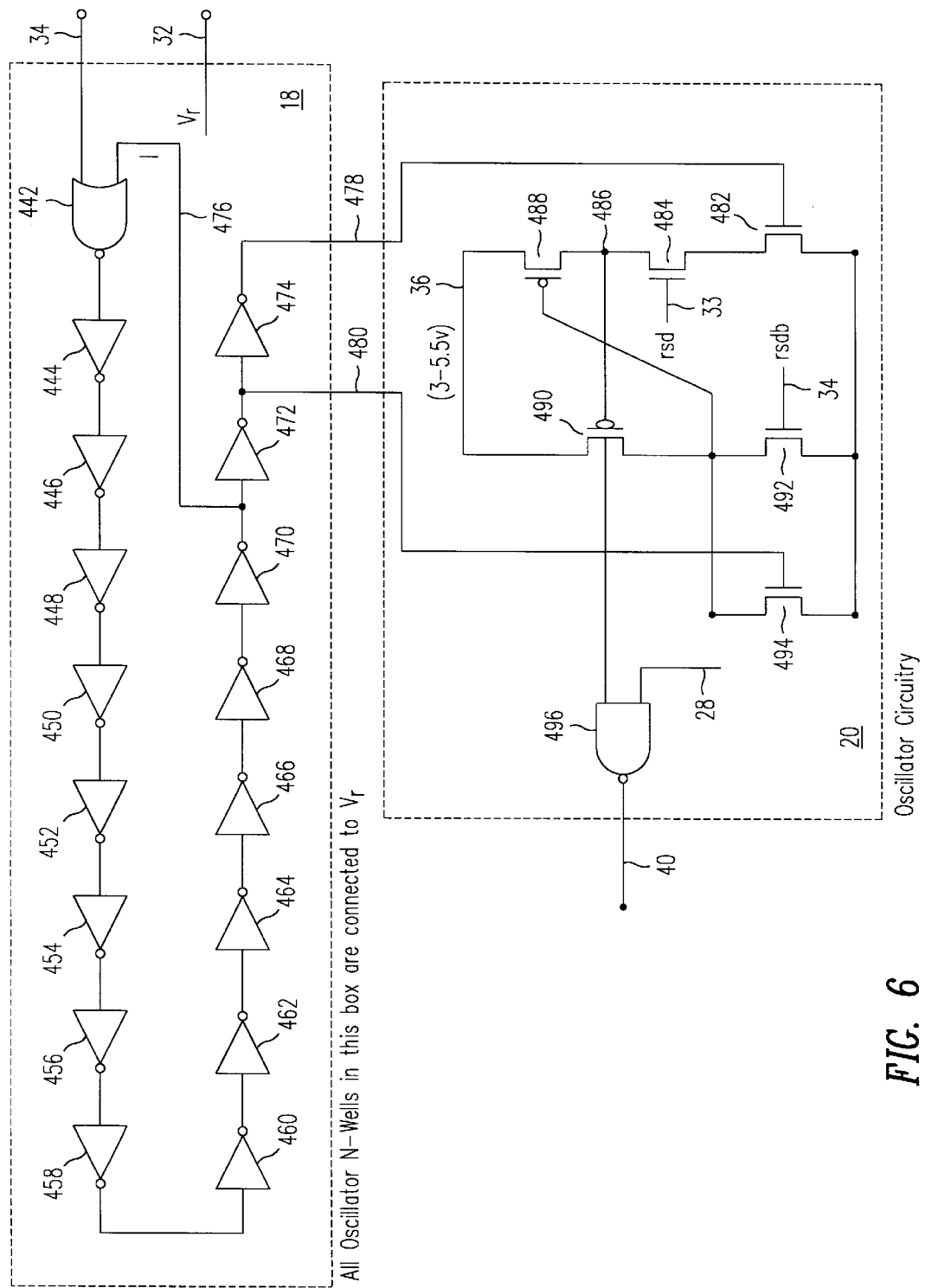

FIG. 6 illustrates details of the ring oscillator circuit 18 and voltage translator circuit 20.

Figure 7:
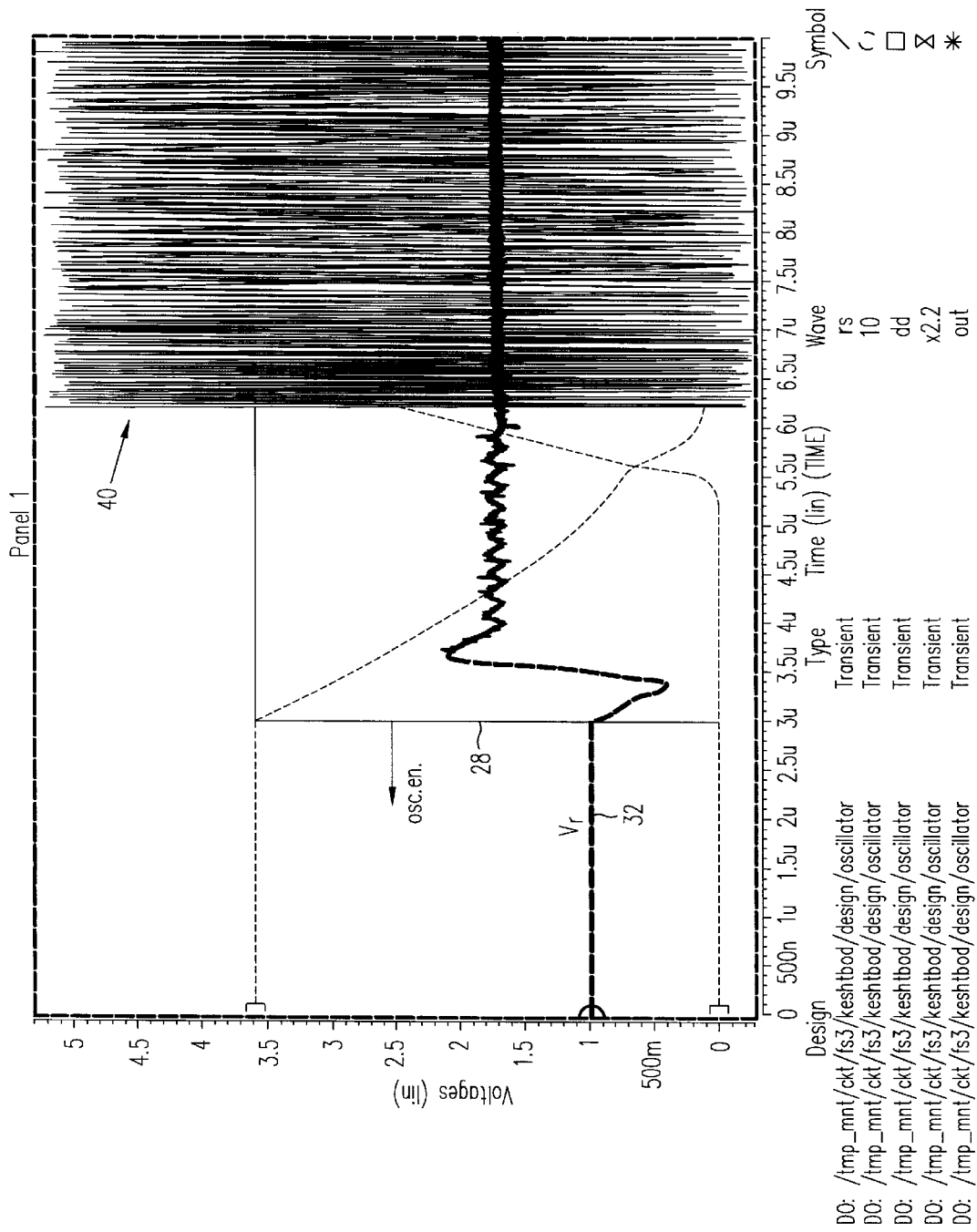

FIG. 7 shows a graph of the behavior of some of the signals employed by the internal oscillator circuit 10.

Figure 8:
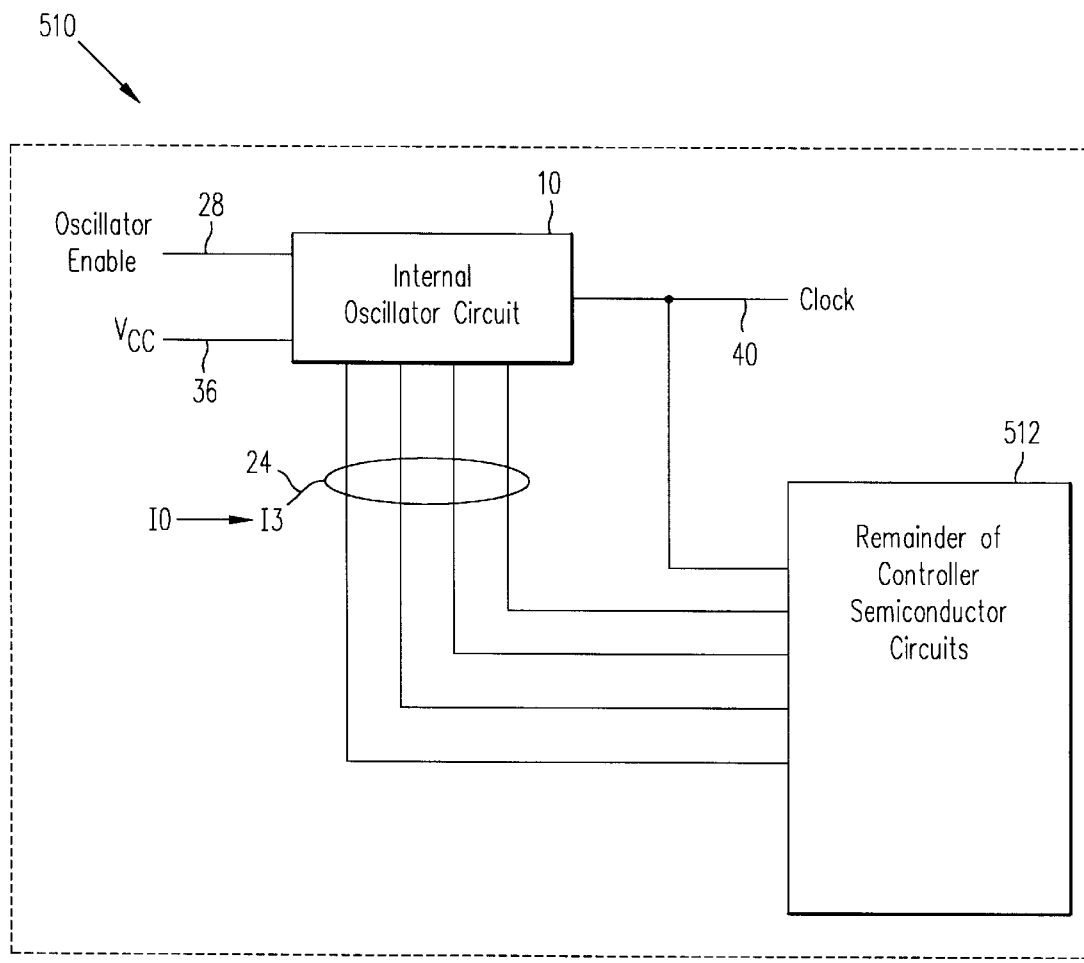

FIG. 8 shows an example application of the internal oscillator circuit in accordance with an embodiment of the present invention.

DETAILED DESCRIPTION OF THE PREFERRED EMBODIMENTS

Referring now to the drawing, FIG. 1 illustrates an internal oscillator circuit 10 according to principles of the present invention. In FIG. 1, the internal oscillator circuit 10 is shown to include: a decoder circuit 12; a voltage regulator circuit 16; a ring oscillator circuit 18; a voltage translator circuit 20 and a delay generator circuit 22, in accordance with an embodiment of the present invention.

The decoder circuit 12 is responsive to frequency selection signals 24 and is operative to develop pull-up selection signals 26 for use by the voltage regulator circuit 16. The voltage regulator circuit 16 is coupled to the decoder circuit 12 through the pull-up selection signals 26 and receives an oscillator enable signal 28 and a Vcc signal 36. The latter two signals are generated and provided to the voltage regulator circuit 16 by a user of the internal oscillator circuit 10. This will become more clear during a later discussion of one of the uses of the internal oscillator circuit 10. The voltage regulator circuit 16 is additionally coupled to receive a first delay signal 30 from the delay generator circuit 22 and it is operative to output a Vr signal 32 for use by the ring oscillator circuit 18. The Vr signal 32 is also fed back to the voltage regulator circuit 16 as an input thereto.

frequencies that may be selected, by a user of the internal oscillator circuit 10, as the frequency of the system clock or the clock out signal 40. That is, since there are 4 signals and each of these signals is a binary signal, there are $2^4$, or 16, distinct possibilities of values that may be represented by the frequency selection signals 24. Although the frequency selection signals 24 are shown to include four signals in the embodiment of FIG. 1, other number of signals may be employed without departing from the spirit of this invention, as is clear to those of ordinary skill in the art. Furthermore, the frequency selection signals 24 are programmable, through firmware code, to represent different frequency values. For example, they may be programmed to represent 50 mhz or 100 mhz, etc. This allows the internal oscillator circuit 10 to be programmable so as to have the capability to generate different frequencies without undergoing any hardware changes.

In operation, the decoder circuit 12 receives a frequency value coupled onto the frequency selection signals 24 and operates to translate or decode this frequency value into a 16-bit digital value for turning "on" one of sixteen P-channel (pull-up) transistors (not shown in FIG. 1) within the voltage regulator circuit 16 while maintaining the remaining fifteen P-channel (pull-up) transistors in the "off" position. The size of the P-channel transistor device that is being turned "on" determines the frequency of the clock out signal 40. Table 1 below presents some examples of the correlation between the P-channel (pull-up) transistor sizes, the voltage out signal 32 and the frequency of the clock out signal 40 at room temperature.

TABLE 1

P-ch transistor size by 1, Vr and related p in Mhz, at 25° C. typical condition.

| Value of $I_0$–$I_3$ | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| Size of the p-channel transistor devices | 11.6 | 11.3 | 11.0 | 10.6 | 10.2 | 9.9 | 9.4 | 9.2 | 8.8 | 8.4 | 7.9 | 7.3 | 6.7 | 6.2 | 5.6 | 5.0 |
| Vout | 2.09 | 2.07 | 2.05 | 2.02 | 2.00 | 1.98 | 1.95 | 1.94 | 1.92 | 1.90 | 1.88 | 1.85 | 1.83 | 1.82 | 1.79 | 1.77 |
| Frequency of clock out | 103.8 | 101.8 | 99.8 | 97.6 | 95.8 | 94.2 | 91.8 | 90 | 88 | 88.5 | 83.8 | 81.6 | 80 | 78 | 76.4 | 74 |

The delay generator circuit 22 is also coupled to receive the oscillator enable signal 28 and it operates to generate a second delay signal 34 for use by the ring oscillator circuit 18. In response to the voltage out signal 32 and the second delay signal 34, the ring oscillator circuit 18 operates to generate a ring oscillator output voltage signal 38 for use by the voltage translator circuit 20. The voltage translator circuit 20, in turn, develops a clock out signal 40, which is further processed by other circuits (not shown in FIG. 1 but shown and discussed with respect to other figures of this document) prior to use, as a system clock, by digital circuits.

The internal oscillator circuit 10 is generally employed within a semiconductor device (or integrated circuit (IC)) for generating a system clock for use by other circuitry of the semiconductor device. Although, the internal oscillator circuit 10 may be utilized in applications known to those of ordinary skill in the art. One such application will be further described with respect to another figure of this document.

The frequency selection signals 24 are shown to include 4 signals in FIG. 1 for digitally indicating one out of 16

The top row of Table 1 includes the values of the frequency selection signals 24, in the case where they include 4 bits, $I_0$–$I_3$. the second row of the Table 1 includes the sizes of the P-channel transistor devices included in the voltage regulator circuit 16 (since 4 bits of frequency selection signals are used in this example, there are 16 different sizes of transistors), the third row of Table 1 includes the value of the Vr signal 32 with respect to each of the P-channel transistors and the last row of Table 1 includes the frequency associated with the clock out signal 40 for each of the transistor sizes indicated in the second row of Table 1. For example, where the value of the frequency selection signals 24 is '0', a P-channel transistor device within the voltage regulator circuit 16 having a size of 5.0 is turned "on" (as shown by the value appearing in the last column of the second row of Table 1), the voltage associated with the Vr signal 32 is 1.77 V (as shown by the value appearing in the last column of the second row of Table 1) and the frequency of the clock out signal 40 is 74 MHz (as shown by the value appearing in the last column of the last row of Table 1).

TABLE 2

Oscillation Frequencies

| Xsistor size | Typ 25 | Typ 95 | Typ 0 | S1.95 | S1.25 | Slow 0 | Fast 95 | Fast 25 | Fast 0 |
|---|---|---|---|---|---|---|---|---|---|
| 10.6/1 | 97.6 | 96.4 | 97.4 | 97.8 | 96.6 | 95.6 | 97.8 | 97.6 | 96.8 |
| 8.8/1 | 88 | 92.2 | 85.0 | | 85.0 | | | 89.2 | |
| 7.3/1 | 81.6 | 83.2 | 79.6 | | 78.8 | | | 83.4 | |

Table 2 is presented above to show the change in the frequency of the clock-out signal 40 as a function of the change in temperature and manufacturing process given particular pull-up transistor sizes as experienced by the inventor of the present invention. The first column of Table 2 shows three transistor sizes (in three rows, respectively) of the p-channel pull-up transistors within the voltage regulator circuit 16. The next three columns show the frequency or speed of the clock-out signal 40 under three different temperature conditions. For example, the second column shows the frequency of the clock out signal 40 when the internal oscillator circuit 10 is operating at a temperature of 25 degrees Centigrade and under typical process conditions. The third column of the Table 2 shows the frequency of the clock out signal 40 when the internal oscillator circuit 10 is operating at a temperature of 95 degrees Centigrade and the fourth column of Table 2 shows the frequency of the clock out signal 40 when the internal oscillator circuit 10 is operating at a temperature of 0 degrees under typical conditions.

In reading Table 2, the reader is directed to sample transistor sizes, such as, for example, a pull-up transistor being of a size 10.6/1 and the temperature at which the internal oscillator circuit 10 is operated being at 95 degrees Centigrade, the speed of the clock-out signal 40 will be 96.4 MHz (Megahertz). A pull-up transistor of size 8.8/1, operating at a temperature of 25 degrees Centigrade will cause the clock out signal 40 to operate at 88 MHz and so on. As shown in Table 2, the internal oscillator circuit 10 causes the clock out signal 40 to change only by 0.2 Mhz when undergoing a change of temperature from 25 to 0 degrees Centigrade and when going from 0 to 95 degrees Centigrade, which is a drastic temperature change, the speed of the clock out signal 40 changes by 1 Mhz. The fifth, sixth and seventh columns of Table show the frequency of the clock out signal 40 at conditions where the process used to manufacture the circuitry of internal oscillator circuit 10 causes the latter to operate slowly (e.g. the polysilicon widths in the process are wide) and at 95, 25, and 0 degrees Centigrade and the process is slow, the frequency of the clock out signal 40, which is shown to be 95.6 Mhz, decreases from that of when the process is slow but the temperature is 25 degrees Centigrade, which is shown to be 96.6 MHz.

In contrast thereto, the last three columns of Table 2 show the frequency of the clock out signal 40 when the process used to manufacture the internal oscillator circuit 10 is causing the latter to operate fast. The eighth, ninth and tenth columns, respectively, show the frequency of the clock out signal 40 when the process is fast and the temperature at which the internal oscillator 10 is operating is at 95, 25 and 0 degrees Centigrade.

It should be noted that the embodiments shown in the figures included herein are designed to have the clock out signal 40 operate at 96 MHz. Accordingly, while the clock out signal 40 can operate at other frequencies, it is the inventor's experience that the greater the deviation from operating the clock out signal at 96 MHz, the greater the variance in such a frequency due to temperature and process changes.

The delay generator circuit 22 causes the ring oscillator circuit 18 to shut off and effectively become non-operational when the internal oscillator circuit 10 is first turned on so as to avoid any jitters (jitters are undesirable fluctuations that are typically present on a signal generated by circuitry undergoing abrupt transitions, such as upon initialization) that may ride on the Vr signal 32 as a result of the ramping up of the voltage regulator circuit 16. The delay generator circuit 22 also generates a delay signal for reducing the resistance of an RC circuit, which will be discussed later, thereby speeding up the recovery time associated with the voltage regulator circuit 16.

For example, during initialization of the internal oscillator circuit 10 and while the voltage regulator circuit 16 is first turned on, the delay generator circuit 22 uses the oscillator enable signal 28 to de-activate the second delay signal 34 and thereby shut off the ring oscillator circuit 18 for approximately 3 microseconds. The way in which this is performed is explained in more detail in later discussions with respect to other figures. After 3 microseconds, the jitters that may have potentially ridden onto the Vr signal 32 cease to exist and the ring oscillator circuit 18 is caused to become operational as a result of the activation of the oscillator enable signal 28, which causes activation of the second delay signal 34 within the delay generator circuit 22. While the ring oscillator circuit 18 is shut off, the ring oscillator output voltage signal 38 is at a dc, or constant, voltage level. In one embodiment of the present invention, this constant or dc voltage level may be a logical high state and in another embodiment of the present invention, this level may be a logical low state. While in the example provided above the delay generator circuit 22 introduces 3 microseconds of delay before the ring oscillator circuit 18 is turned on, in alternative embodiments, other lengths of delay may be employed without departing from the spirit of the present invention.

As will be more apparent shortly, the first delay signal 30 causes the P-channel (pull-up) transistors of the voltage regulator circuit 16 to turn "on" and "off" while the second delay signal 34 causes the ring oscillator circuit 18 to turn "on" and "off".

Figure 2:
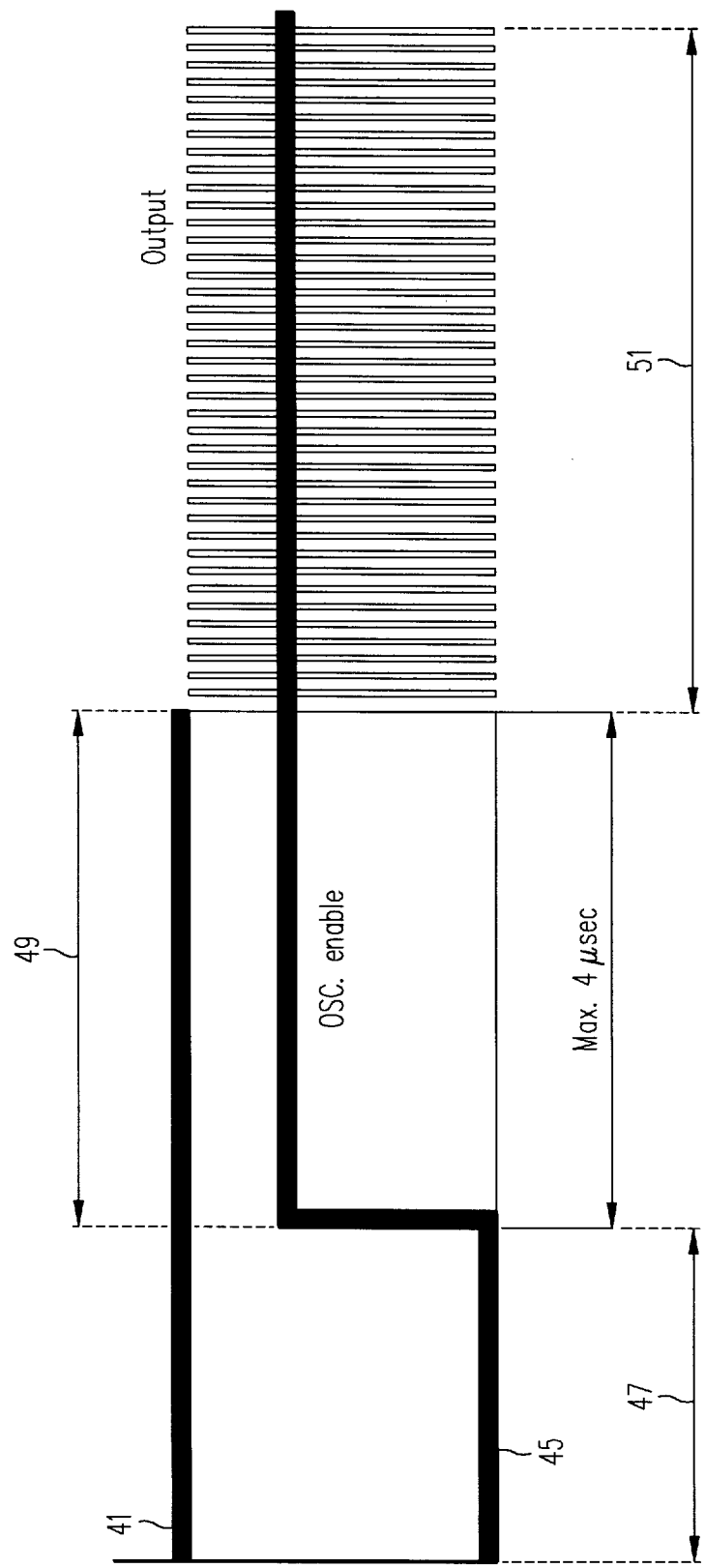
FIG. 2 shows a graph of the state of the output of the oscillator circuit 10 vs. the oscillator enable signal shown in FIG. 1.

FIG. 2 shows a graph of the state of the oscillator output and oscillator enable signals shown in FIG. 1. At 41, there is shown the state of the clock out signal 40 (in FIG. 1) as a function of time. At 45, there is shown the state of the oscillator enable signal 28 (in FIG. 1) as a function of time. At 47, the time span during which the oscillator enable signal 28 is inactive is shown and at 49 and 51, the time span during which the oscillator enable signal 28 is active is shown. At 49 however, the ring oscillator circuit 18 is "off" and at 51, the ring oscillator circuit 18 is "on". When the state 45 of the oscillator enable signal is inactive, at 47, the state 41 of the clock out signal is at a dc voltage level that is a logical 'high', or for example, at 5 V. When the oscillator enable signal is activated and at 49, there is a period of time during which the state 41 of the clock out signal is without a frequency, i.e. the clock out signal does not change. The duration of time, at 49, is essentially a delay period for prevention of jitter effects on the clock output signal 40, as earlier discussed with respect to FIG. 1. This delay is typically 3 microseconds and a maximum of 4 microseconds in one embodiment of the present invention and can be more or less in other embodiments of the present invention.

Once this delay period, or 49, ends, the output of the ring oscillator circuit 18 (in FIG. 1), as represented by the state of the clock out signal starts to oscillate at a particular frequency. The latter state is shown in FIG. 2 at 50. While not shown in FIG. 2, the boundary between 48 and 50 is the time when the second delay signal 34 (in FIG. 1) becomes activated, thereby controlling the turning "on" and "off" of the ring oscillator circuit 18, i.e. during 49, the second delay signal 34 is inactive and during 51, it is active. Furthermore, during 49, as the voltage regulator circuit 16 continues to operate, the ring oscillator circuit 18 is "off" and at 51, the ring oscillator circuit 18 is turned "on".

It is important to note that once the ring oscillator circuit 18 is turned "on", at 51, the frequency of the clock out signal 40 remains fairly constant despite any variations due to supply voltage, temperature, process or otherwise. It is for this reason that the output of the internal oscillator circuit 10 (shown in FIG. 1), or clock out signal 40, is reliably used by other digital circuits as a system clock.

FIG. 3 shows a more detailed block diagram of the voltage regulator circuit 16 of FIG. 1. As in FIG. 1, the decoder circuit 12 is shown to receive the selection signals 24 and to be coupled to the voltage regulator circuit 16 through the pull-up selection signals 26.

Further shown in FIG. 3 is pull-up devices 42, a reference voltage generator circuit 44, a voltage shifter circuit 46, a low pass filter circuit 48 and a power generator circuit 50. The pull-up devices 42 comprise 16 P-channel (pull-up) transistors as discussed with respect to FIG. 1. The operation of each of these P-channel transistors is controlled by one of the sixteen signals of the pull-up selection signals 26. The pull-up devices 42 receive, as input, the pull-up selection signals 26 and the Vr signal 32 for further use in controlling the operations of the reference voltage generator. That is, the pull-up selection signals 26 cause one of the pull-up transistors (the pull-up transistors are generally of the p-channel transistor type) of the pull-up devices 42 to be turned 'on' by coupling the base terminal of pull-up transistor being turned 'on' to logic state '0'.

The reference voltage generator circuit 44 is coupled to receive the Vcc signal 36, the oscillator enable signal 28 and the Vr signal 32. The reference voltage generator circuit 44 develops a Vref signal 52 for use by the voltage shifter circuit 46, which in turn generates a shifted voltage signal 54 for use by the low pass filter circuit 48. The low pass filter circuit 48 is coupled to receive the shifted voltage signal 54 and the first delay signal 30 and generates a filtered output signal 56 for use by the power generator circuit 50. The power generator circuit 50 is coupled to receive the output signal 56 and in response thereto generates the Vr signal 32. As noted earlier, the Vr signal 32 is fed back as input to the reference voltage generator 44.

The voltage level of the $V_r$ signal 32 remains substantially unaffected by variations in the voltage level of the Vcc signal 36, which may result from factors including variations in the system power supply (not shown).

The reference voltage generator circuit 44 and the pull-up devices 42 are responsive to the $V_r$ signal 32 that is generated by the power generator 50 as noted earlier. The Vref signal 52 that is developed by the voltage generator circuit 44 remains substantially constant despite fluctuations in the $V_r$ signal caused by temperature variations in the environment of circuit 10, processing related variations in the components of circuit 10, and variations in the voltage level of the Vcc signal 36. For example, temperature variations in the environment of an electronic system hosting circuit 10 may range from 0 C. to 95 C. The N-channel and P-channel transistors used to implement circuit 10 are known to operate differently under various temperature constraints. Processing related variations include variations in device characteristics due to variations in the process technology used to manufacture components of circuit 10.

The voltage shifter circuit shown in FIG. 3 operates to shift the voltage level of the Vref signal 52 to a different voltage level. In the embodiment of FIG. 3, the voltage shifter circuit 46 shifts the voltage level of the Vref signal 52 from a 0–3 V range to a voltage level of 0–5.5 V range associated with the shifted voltage signal 54. The voltage shifter circuit 46 operates to translate the voltage level of the Vref signal 52 such that it draws from the voltage level of the Vcc signal 36 instead of the voltage level of the Vr signal 32, the latter being at 5 or 5.5 V and the former being at lower voltage in an embodiment of the present invention.

The low pass filter circuit 48 operates, as a low pass filter, to prevent high frequency components of the shifted voltage signal 54 from ultimately passing through to the Vr signal 32 yet operates to allow lower frequency components to pass therethrough. The power generator circuit 50 increases the drive in the output signal 56 to develop the Vr signal 32 for allowing the latter to properly drive many digital devices without failure due to lack of power.

The voltage regulator circuit 16 and the delay generator circuit 22 (shown in FIG. 1) are shown in more detail, particularly at a transistor-level detail, in FIG. 4. The pull-up devices 42 and the reference voltage generator circuit 44 are shown, in FIG. 4, to include: a resistor 60 having a first terminal 62 and a second terminal 64; a transistor 66 having a gate terminal 68, a drain terminal 70 and a source terminal 72; a transistor 74 having a gate terminal 76, a drain terminal 78 and a source terminal 80; a transistor 82 having a gate terminal 84, a drain terminal 86 and a drain terminal 88; a transistor 90 having a gate terminal 92, a drain terminal 96 and a source terminal 94; a transistor 98 having a gate terminal 100, a drain terminal 104 and a source terminal 102; a transistor 106 having a gate terminal 106, a drain terminal 112 and a source terminal 110; and a transistor 114 having a gate terminal 116, a drain terminal 120 and a source terminal 118.

The transistors 66, 74, 82 and 106 are p-channel transistors and the transistors 90, 114 and 98 are n-channel transistors. Additionally, the n-wells of the p-channel transistors 66, 74, 82 and 106 of the pull-up devices 42 and the reference voltage generator circuit 44 are connected to the Vr signal 32. The first terminal 62 of the resistor 60, the source terminal 72 of transistor 66, the source terminal 80 of transistor 74, the source terminal 88 of transistor 82, the source terminal 110 of transistor 106, the gate terminal 92 of the transistor 90 and the gate terminal 116 of the transistor 114 are coupled together and to the Vr signal 32. The second terminal 64 of the resistor 60 is coupled to the drain terminal 96 of the transistor 90, the gate terminal 108 of the transistor 106, the drain terminal 70 of the transistor 66, the drain terminal 78 of the transistor 74 and the drain terminal 86 of the transistor 82 at node 122. The source terminal 118 of the transistor 114 is coupled to the source terminal 94 of the transistor 90 and the drain terminal 104 of the transistor 98 at node 126. The source terminal 102 of transistor 98 is connected to a ground terminal 124 and the gate terminal 100 of the transistor 98 is connected to the oscillator enable signal 28. The drain terminal 112 of the transistor 106 is connected to the drain terminal 120 of the transistor 114 to generate the Vref signal 52.

While not shown in FIG. 4, there are sixteen p-channel transistors such as those of transistors 66, 74 and 82 in accordance with one embodiment of the present invention (these transistors are the same as those discussed with reference to Tables 1 and 2 hereinabove and called pull-up transistors). For example, for each of the pull-up selection signals 26, there is such a p-channel transistor and each of the respective gate terminals of these transistors is connected to a respective one of the pull-up selection signals 26. Accordingly, in FIG. 4, the gate terminal 68 of the transistor 66 is connected to a pull-up signal 128, the gate terminal 76 of the transistor 74 is connected to a pull-up signal 130 and the gate terminal 84 of the transistor 82 is connected to a pull-up signal 132. Pull-up signals 128, 130 and 132 are included among the pull-up selection signals 26.

The voltage shifter circuit 46 receives the Vref signal 52 as input at a gate terminal 134 of a transistor 136. The voltage shifter circuit 46 includes: the transistor 136 having the gate terminal 134, a drain terminal 140 and a source terminal 138; a transistor 142 having a gate terminal 144, a source terminal 146 and a source terminal 148; a transistor 150 having a gate terminal 152, a drain terminal 156 and a source terminal 154; a transistor 158 having a gate terminal 162, a drain terminal 164 and a source terminal 160; a transistor 166 having a gate terminal 168, a drain terminal 172 and a source terminal 170; and a capacitor 174 having a first terminal 176 and a second terminal 178.

The gate terminal 168 of the transistor 166 is coupled to the oscillator enable signal 28 and the source terminal 170 of the transistor 166 is coupled to the ground terminal 124. The gate terminal 144 of the transistor 142 is also connected to the ground terminal 124. The source terminal 148 of the transistor 142 and the source terminal 154 of the transistor 150 are coupled to the Vcc signal 36. The gate terminal 152 of the transistor is connected to the ground terminal 124. The drain terminal 156 of the transistor 150, the source terminal 164 of the transistor 158 and the first terminal 176 of the capacitor 174 are coupled together to form the shifted voltage signal 54. The second terminal 178 of the capacitor 174 is connected to the ground terminal 124. The source terminal 138 of the transistor 136, the source terminal 160 of the transistor 158 and the drain terminal 172 of the transistor 166 are coupled together. The drain terminal 146 of the transistor 142, the drain terminal 140 of the transistor 136 and the gate terminal 162 of the transistor 158 are coupled together at node 180.

The transistors 142 and 150 of the voltage shifter circuit are p-channel transistors and the transistors 136, 158 and 166 are n-channel transistors.

The low pass filter 48, in FIG. 4, is shown to include: a transistor 182 having a gate terminal 184, a drain terminal 186 and a source terminal 188; a transistor 190 having a gate terminal 192, a drain terminal 196 and a source terminal 194; and a capacitor 200 having a first terminal 202 and a second terminal 204. The transistors 182 and 190 of the low pass filter circuit 48 are coupled together in-parallel. Further, their drain terminals are coupled to receive the shifted voltage signal 54 from the voltage shifter circuit 46. The gate terminal 184 of the transistor 182 is coupled to the first delay signal 30 and the gate terminal 192 of the transistor 190 is coupled to the ground terminal 124. The first terminal 202 of the capacitor 200 is coupled to the source terminals 188 and 194 of the transistors 182 and 190 to generate the output signal 56, which serves as input to the power generator circuit 50. The second terminal of the capacitor 200 is coupled to the ground terminal 124.

The power generator circuit 50 includes a transistor 206, which is a p-channel transistor having a source terminal 208, a drain terminal 210 and a gate terminal 212. The drain terminal 210 of the transistor 206 forms the Vr signal 32, the source terminal 208 of the transistor 206 is connected to the Vcc signal 36 and the gate terminal 212 of the transistor 206 is coupled the output signal 56.

In an alternative embodiment of the present invention, the voltage regulator circuit 16 may optionally include an inverter 214 having an input terminal 216 and an output terminal 218 in addition to a transistor 220 of the type n-channel, having a gate terminal 222, a drain terminal 224 and a source terminal 226. The input terminal 216 of the inverter 214 is shown connected to the oscillator enable signal 28 and the output terminal 218 of the inverter 214 is shown connected to the gate terminal 222 of the transistor 220. The drain terminal 224 of the transistor 220 is shown connected to the Vcc signal 36 and the source terminal 226 is shown coupled to the output signal 56, which as discussed earlier is connected to the first terminal 202 of the capacitor 200. The inverter 214 inverts the polarity of the oscillator enable signal 28 such that when the oscillator enable signal 28 is at logic state '1', the output terminal 218 of the inverter 214 will take on the value '0'. The inverter 214 and the transistor 220 may be optionally used in the voltage regulator circuit 16 to 'jump-start' the Vr signal 32, as will be discussed in more detail later.

Further shown in FIG. 4, the delay generator circuit 22 includes: a transistor 228 having a gate terminal 230, a drain terminal 232 and a source terminal 234; a transistor 236 having a get terminal 238, a drain terminal 240 and a source terminal 24; a transistor 244 having a gate terminal 246, a drain terminal 250 and a source terminal 244; a transistor 252 having a gate terminal 254, a drain terminal 258 and a source terminal 256; a transistor 260 having a gate terminal 262, a drain terminal 266 and a source terminal 264; a transistor 268 having a gate terminal 270, a drain terminal 272 and a source terminal 274; a transistor 276 having a gate terminal 278, a drain terminal 282 and a source terminal 280; a transistor 284 having a gate terminal 286, a drain terminal 288 and a source terminal 290; an inverter 292 having an input terminal 294 and an output terminal 296; a capacitor 300 having a first terminal 302 and a second terminal 304; and a capacitor 306 having a first terminal 308 and a second terminal 310. The transistors 228, 244, 260 and 276 of the delay generator circuit 22 are p-channel transistors and the transistors 236, 252, 268 and 284 are n-channel transistors.

The gate terminals 230 and 238 of the transistors 228 and 236, respectively, are shown, in FIG. 4, connected to the oscillator enable signal 28. The source terminal 242 of the transistor 236 is shown connected to the ground terminal 124. Similarly, the source terminals 256, 274 and 290 of the transistors 252, 268 and 284, respectively, as well as the second terminals 304 and 310 of the capacitors 300 and 306, respectively, are shown coupled to the ground terminal 124.

The source terminals 234, 248, 264 and 280 of the transistors 228, 244, 260 and 276 are shown coupled together. The drain terminal 232 of the transistor 228, the drain terminal 240 of the transistor 236, the gate terminal 246 of the transistor 244, the gate terminal 254 of the transistor 252 and the first terminal 302 of the capacitor 300 are coupled together. The drain terminal 250 of the transistor 244, the drain terminal 258 of the transistor 252, the gate terminal 262 of the transistor 260, the gate terminal 270 of the transistor 268 and the first terminal 308 of the capacitor 306 are coupled together to generate the first delay signal 30. The drain terminal 266 of the transistor 260, the drain terminal 272 of the transistor 268, the gate terminal 278 of the transistor 276 and the gate terminal 286 of the transistor 284 are coupled together. The drain terminal 282 of the transistor 276 and the drain terminal 288 of the transistor 284 are coupled to the input terminal 294 of the inverter 292. The second delay signal 34 is shown generated at the output terminal 296 of the inverter 292.

In operation starting with the pull-up devices 42 and the reference voltage generator 44, one of the sixteen p-channel transistors (referred to as pull-up transistors in earlier figures), i.e. one of the transistors 66, 74 and 82, is turned on due to the logic state of one of the selection signals 26 being '0'. A user of the internal oscillator circuit 10 programs the selection signals 24 (shown in FIG. 1) thereby selecting one of the sixteen selection signals 26 to be at a logic value '0'. This, in turn, activates one of the sixteen p-channel pull-up transistors. The selection of a particular value onto the selection signals 26 sets the frequency that is to be ultimately controlled by the Vr signal 32.

As shown in FIG. 4, the transistors 66, 74 and 82 have associated therewith various sizes. For example, the transistor 66 is shown to have a size of 11.6/1 whereas the transistor 82 has a size of 5.0/1 (the size of the transistor 74 is not shown in FIG. 4 but it should be noted that it is a different size than that which is shown for the transistors 66 and 82). The size of the selected pull-up transistor determines the voltage level of the output signal (or the Vr signal 32) of the voltage regulator circuit 16, which ultimately determines the frequency of the oscillation of the clock out signal 40 (shown in FIG. 1). With this technique, sixteen different frequencies can be selected. As earlier noted, in other than 16 p-channel (or pull-up) transistors may be used to generate a different number of available frequencies without departing from the scope and spirit of the present invention. It should be clear to one of ordinary skill in the art however, that a large range of frequencies can be covered even with the use of 16 pull-up transistors. Alternatively, a smaller number of main frequencies may be covered with a subset of the 16 pull-up transistors with the remaining pull-up transistors being used to trimming and adjusting the main frequencies. This is an option determined by the user of the circuit 10. Once one of the transistors of the pull-up devices 42 is activated, through selection of one of the selection signals 26 to be at a logic state of '0', it will remain activated until another transistor is selected.

The decoder circuit 12 (shown in FIG. 1) translates (or decodes) the 4-bit binary representation of a value programmed onto the selection signals 24 to a 16-bit value appearing on the selection signals 26. This latter 16-bit value is one that includes all '1's with the exception of one bit being '0', which bit turns the respective one of the pull-up transistors (shown in FIG. 4) 'on' as described earlier.

As earlier noted, the reference voltage generator 44 and the pull-up devices 42 are responsive to the $V_r$ signal 32 generated at the source terminal of the transistor 206 of the power generator circuit 50 and are operative to develop a signal having a voltage level at node 122 that remains substantially constant despite fluctuations in the $V_r$ signal caused by temperature variations in the environment of circuit 10, processing related variations in the components of circuit 10, and variations in the system voltage level $V_{cc}$. For example, temperature variations in the environment of an electronic system hosting circuit 10 may range from 0 C. to 95 C. The n-channel and p-channel transistors used to implement circuit 10 are known to operate differently under various temperature constraints. Processing related variations include variations in device characteristics due to variations in the process technology used to manufacture components of circuit 10.

For the purpose of discussion, assuming that the pull-up signal 128 is at logic state '0', the transistor 66 will be turned 'on'. Transistor 90 is turned 'on' when node 126 is pulled down toward ground as transistor 98 is turned 'on', which will be shortly described. The coupling together of the resistor 60 and the transistors 66 and 90 causes the voltage level of the $V_r$ signal 32 to be divided. For example, if the voltage level of the $V_r$ signal 32 is at 3.3 V, the voltage level at node 122 will be at 2 V. Note that a similar operation is performed if a pull-up transistor other than the transistor 66 is turned 'on'.

In accordance with principles of the present invention, the resistor value of resistor 60 and the sizes of transistors 66 and 90 are chosen, relative to each other, to maintain the voltage level at node 122 substantially constant despite fluctuations in the voltage, and variations in process-related characteristics of the elements of circuit 10. Also, the characteristics of the components of circuit are taken into account in determining appropriate resistance values and transistor sizes for resistor 60 and transistors 66, and 90, so as to minimize the effects of the temperature and process variations on the frequency of the clock out signal, which is ultimately used as the clock source to many digital circuits. The temperature and process variations are compensated by proper design of resistor 60 and transistors 66 and 90. Because these elements have different temperature characteristics, compensation is possible.

The transistors 106 and 114 operate as a comparator. In combination, they compare the voltage level at node 122 to the voltage level of the Vr signal 32 and if the latter goes up, the comparator turns 'on' and the difference between the voltage at the gate terminal 108 and 110 of the transistor 106 (which is a large p-channel transistor, for example, of a size 300/2) increases causing the transistor 106 to turn 'on' slightly (or just enough) to prevent the voltage level at node 122 to rise. This raises the voltage at node 52 which raises the voltage at node 56, turning 'off' the transistor 206, thus reducing the voltage level of the Vr signal 32.

As temperature rises, the Vt (threshold voltage) of the transistor 106 drops. In the case where the voltage at node 122 remains constant, transistor 106 turns on, causing the $V_r$ signal 32 to drop. When temperature rises, in order to keep the frequency constant, the voltage level of the Vr signal 32 has to increase and the voltage at node 122 has to rise to compensate for a drop in the Vt of transistor 106. The current through the p-channel transistor 66 and n-channel transistor 90 drop as temperature rises with the rate of current drop depending on the size of the transistors. With respect to the resistor 60, current decreases with higher temperatures. Generally, as temperature rises, the transistor current in the p-channel and n-channel devices drop. This reduces the oscillation frequency in the ring oscillator 18 in FIG. 1. To keep the oscillation frequency constant, the voltage level of the Vr signal 32 has to increase. This is achieved by appropriately sizing the transistors 66 and 90 and the resistor 60.

It should be noted that the remaining p-channel transistors, such as 74 and 82 of the pull-up transistors operate in the same way as described with reference to transistor 66, as each is turned 'on' or activated by the way in which the selection signals 26 is programmed.

When the fabrication process changes slightly, the oscillation frequency has to stay constant. As an example, if the process goes toward a fast corner where the length of the gates of transistors become narrower thereby causing the transistor currents to increase and the thresholds of the transistors to drop. This causes the frequency of the oscillation of the ring oscillator to increase and to compensate for this the voltage level of the $V_r$ signal has to drop.

When the fabrication process causes transistors to operate at fast corner, the Vt of transistor 106 drops and with the same value for the voltage level at node 122, transistor 106 turns 'on' thereby causing the voltage at node 52 to increase, and the voltage at node 180 to decrease, and the voltages at nodes 53 and 56 to increase. Thereafter, transistor 206 is turned off causing the voltage level of the $V_r$ signal 32 to drop.

When the fabrication process moves toward slower corners, the opposite of the above occurs, the oscillation frequency of the ring oscillator drops but the voltage level of the $V_r$ signal 32 goes up to compensate for the effect. That is, the threshold voltage of the transistors 106 increase causing the voltage level of the $V_r$ signal to go up.

In an embodiment, the resistance value of the resistor 60 is 4K Ohms and the sizes of the transistors 90 and 66 are 6.6/0.8 and 11.6/1, respectively. It should be noted that each of the p-channel transistors of the pull-up devices, for example 66, 74 and 82 are of a different size and their sizes, in part, determine the oscillation frequency of the clock-out signal 40 (in FIG. 1).

The delay circuit 22 operates to prevent the output of the ring oscillator, or signal 38 (in FIG. 1) to oscillate upon initialization or power-up of the internal oscillator 10 until some time later (for example 3 microsec.) through control of the oscillator enable signal 28. That is, initially, the oscillator enable signal 28 is at a logic state '0' and after some time, it is raised to logic state '1' and it is only at the latter time when the ring oscillator output is allowed to show oscillations. This is intended to remove or at a minimum reduce any jitter effects upon the clock out signal 40.

In FIG. 4, the transistor 220, being an n-channel transistor, is turned 'on' at initialization or power-up prior to the activation of the oscillation enable signal 28 and during the normal operation of the internal oscillator circuit 10, it is 'off'. This essentially serves as an initial condition to cause the signal 56 to be at a level of approximately 3 or 4 V thereby charging capacitors such as the capacitor 200. The net effect is that voltage levels do not have be raised from the level 0 V once the internal oscillator circuit 10 starts to operate, i.e. the oscillation enable signal 28 becomes '1'. Upon the oscillation enable signal 28 becoming '1', the output 218 of the inverter 216 becomes '0' and the transistor 220 is turned 'off'. By the way, while the oscillation enable signal 28 is low or at logic state '0', the transistors 98 and 166 remain 'off' effectively placing the reference voltage generator circuit 44 and the voltage shifter circuit 46 in a non-operational position thereby helping not to burn any power by those circuits. This is an advantage in reducing the power consumption of the internal oscillator circuit 10.

Referring now to the delay circuit 22 in FIG. 4, when the oscillation enable signal 28 is low, the transistor 228 is 'on' thereby charging the capacitor 300. This turns 'on' the transistor 252, which, in turn, charges the capacitor 306. When the oscillation enable signal 28 goes high or reaches logic state '1', the transistor 228 is turned 'off' and the transistor 236 is turned 'on', which causes the capacitor 300 to be slowly discharged, since the transistor 236 is very small. This causes the node defined by the drain terminal 240 and the first terminal 302 to remain high and the node defined by the drain terminal 250 and the drain terminal 258 to remain low and the node defined by the drain terminal 266 and the drain terminal 272 to remain high for sometime. Ultimately, the node at 33, which is formed by the drain terminal 282 and the drain terminal 288 remains low and the second delay signal 34 remains high for 3–4 micro seconds before changing.

The sizes of the transistors of the reference voltage generator circuit 44 are as follows: The transistor 106 has a size of 300/2; the transistor 114 has a size of 2/2 and the transistor 98 has a size of 100/0.7. While these are sizes typically used for these transistors, other sizes may be employed talking into account the relative sizes of the transistors.

At steady state, the transistor 106 is slightly 'on' as soon as there is any drop in the voltage level of the Vr signal 32, the transistor 106 will turn 'off' thereby causing the voltage level at the Vref signal 52 to drop. This raises the voltage level of the Vr signal higher therefore keeping the Vr signal 32 fairly constant. Thus, the voltage level of the Vref signal 52 will violently change and ultimately, the low pass filter circuit 48 prevents this violent fluctuation on the Vref signal 52 to carry through to the Vr signal 32.

The output of the reference voltage generator circuit 44 at the Vref signal 52 swings between voltages 0–3 V and the voltage shifter circuit 46 operates to translate or shift this voltage to 0–5 V. When the voltage at the Vref signal 52 is low or at 0 V, the transistor 136 will be 'off' while the transistor 142 will be 'on' to drive the voltage at terminal 162 up and turn 'on' the transistor 158 and node 53 will be low or at voltage level 0 V. Accordingly, the voltage level 0 V at the Vref signal 52 is maintained the same at node 53 by the voltage shifter circuit 46. When the voltage level at the Vref signal 52 is high or at 3 V, the transistor 136 is turned 'on', the transistor 158 is turned 'off' and voltage level at 36, which is approximately 5 V appears at the node 53.

The low pass filter circuit 48 operates to prevent voltage fluctuations of the signal 54 from being carried through the low pass filter circuit 48. This consequently prevents frequency fluctuations on the clock out signal 40.

When the internal oscillator is first powered-on, the first delay signal 30 will be at a logic state of '0' thereby turning 'on' the p-channel transistor 182. The p-channel transistor 190 is 'on' all the time since its gate terminal 192 is connected to ground 124 and therefore operates as a resistor. After a specific amount of time delay, the first delay signal 30 goes to logic state '1' thereby turning 'off' the transistor 182. The sizes of the transistors 182 and 190 are selected so as to have the transistor 190 be approximately 120 times smaller than the size of the transistor 182. In one embodiment, the size of the transistor 190 is 2/60 while the size of the transistor 182 is 4/1. This effectively reduces the resistance through the transistor 190 to a small resistance value. During the time when the first delay signal 30 is at logic state '0' and the transistor 182 is 'on' and due to the smaller size of the resistor 190 with respect to the transistor 182, the response time of the RC filter decreases, this helps the Vr signal reach the desired voltage level. Thereafter, when the first delay signal 30 goes to the logic state '1', the transistor 182 is turned 'off' and the voltage level at 56 is maintained the same. During the latter, which is during the normal operation of the internal oscillator 10, the transistor 190 operates as a resistor and in combination with the capacitor 200 operates as a low pass filter thereby preventing the voltage fluctuations from reaching Vr.

Within the power generator circuit 50, the transistor 206 is a large transistor, for example, having a size of 300/0.5 and operates to help drive the various nodes to which the Vr signal 32 provides input. The size of the transistor 206 allows for much current to pass therethrough for supplying enough power to other circuitry (not shown in FIG. 4) to which the Vr signal 32 is provided as input.

FIG. 5 shows details of the circuitry included in the pull-up devices 42, the decoder circuit 12 to receive the selection signals 24. Each of the signals (I0–I3) within the selection signals 24 are coupled to an inverter, 400–406, respectively, in addition to being coupled to sixteen NAND gates, 408–438. The output of the latter NAND gates determines which one of the sixteen p-channel transistors within the pull-up devices 42 are turned 'on' or activated. For example, if a user programs the selection signals 24 to carry a binary value of '1111' or '15' (in decimal notation), the output of the NAND gate 408 will be '0' while the output of the remaining NAND gates, 410–438, will be '1'. This will cause the transistor 66 to turn 'on' and the remaining transistors of the pull-up devices 42 to be 'off'. Since the size of the transistor 66 is of a particular value that is different than the size of the remaining transistors of the pull-up devices 42, it is used to effect the signal 40 to have a particular frequency, as noted above. It should be noted that the N wells of the transistors of the pull-up devices 42, labeled 440, are connected to the Vr signal 32.

FIG. 6 shows details of the ring oscillator circuit 18 and the voltage translator circuit 20. The ring oscillator circuit 18 is shown to include a NOR gate 442, which is responsive to the second delay signal 34 and an inverter signal 476 and its output is coupled to an inverter 444. The inverter 444 is, in turn, coupled to an inverter 446, and in fact, there are fourteen other inverters, 448–474, coupled in series. The input and output of the last inverter in the series, inverter 474, couples the latter to the translator 20. The NOR gate 442 operates as an inverter in that when the second delay signal 34 is at a logic state '0', it toggles with the state of the signal 476 to generate the input to the inverter 444. The second delay signal 34 is active or at a logic state of '0' during operation of the internal oscillator. This signal is initially at a logic state of '1' when the internal oscillator is first powered-on. After a certain amount of time delay after power-on, the amount of delay being dictated by the delay Generator 22 as described elsewhere in this document, the second delay signal 34 goes from logic state '1' to '0'. Thereafter, the output of the NOR gate 442 continuously toggles as does the output of the remaining inverters of the ring oscillator circuit 18. Including the NOR gate 442, the number of inverter-functioning circuits in the ring oscillator circuit 18 are an odd-number, i.e. fifteen. Although, other number of inverter types of circuits may be employed without departing from the scope and spirit of the present invention.

The input to the translator is signals 478, 480, Vdd 36 signals 33 and 34 and oscillator enable signal 28. The signals 478 and 480 are the output and input of the inverter 474, respectively. When the second delay signal 34 is at logic state '1', despite the logic state of the remaining input of the NAND gate 442, the output of the NOR gate 442 will be at logic state '0' and the output of the inverter series ending at 480 and 478 will be at '0' and '1', respectively and will remain so until the second delay signal 34 changes states to logic state '0' at which time the output of the NOR gate 442 will toggle between logic states '0' and '1'.

The translator circuit 20 includes the transistors 490, 492, 494, 488, 484 and 482. The transistors 490 and 488 are p-channel transistors while the remaining transistors of the translator circuit 20 are n-channel transistors. The source terminals of the transistors 488 and 490 are connected to the Vcc signal 36. The drain terminal of the transistor 488, which forms the node 486 is connected to the drain terminal of the transistor 484 and the first input of the NAND gate 496 and the gate terminal of the transistor 490. The gate terminal of the transistor 488 is connected to the drain terminals of the transistors 494 and 492. The gate terminal of the transistor 484 is connected to the signal 33 and the source terminal of the transistor 484 is coupled to the drain terminal of the transistor 482. The gate terminal of the transistor 482 is coupled to the signal 478 and the gate terminal of the transistor 488 is coupled to the drain terminals of the transistors 494 and 492. The terminals of the transistors 494, 492 and 482 are connected to ground. The oscillation enable signal 28 is coupled to the second input of the NAND gate 496. The output of the NAND gate 496 forms the clock output signal 40.

When the oscillator enable signal 28 is at a logic state '0', which effectively disables the ring oscillator, the output of the NAND gate 496 will be at logic state '1' and the clock output signal 40 will be at logic state '1'. But when the state of the oscillator enable signal 28 becomes '1', the clock out signal 40 will oscillate between the voltage levels of '0' and 5 V. This is because the signals 478 and 480 will oscillate but they oscillate at levels between 0 v and 3 V. The transistors of the translator circuit 20 serve to translate the voltage at the node 486 and ultimately the clock out signal 40 to 0–5 V.

During operation and when the ring oscillator circuit 18 is oscillating, when the signal 478 is at logic state '1', the signal 480 is at logic state '0' (signals 478 and 480 are complements of each other due to the inverter 474). Thus, the transistor 482 will be 'on' and the transistor 494 will be 'off'. However, the node at 486 will be driven to 5 V since the transistor 488 will be 'on' and its source terminal is connected to Vcc, which is at 5 V. This is assuming the signal 33 will be at logic state '1'. When the signal 478 goes to logic state '0' and the signal 480 goes to logic state '1', the transistor 494 will be 'on'. The transistor 492 will be 'off' because the signal 34 will be at logic state '0', the transistor 488 will be 'on' and the transistor 490 will be 'off'. The outcome is that the second input to the NAND gate 496 will be at logic state '1' because the voltage at node 484 will be 5 V due to the transistor 488 being 'on'

The size of the transistor 490 is typically 10/0.5 and that of the transistors 494 and 492 are 20/0.5 and 20/0.5, respectively. The size of the transistor 488 is typically 10/0.5 and that of the transistors 484 and 482 are 40/0.5. Although other sizes of transistors may be employed without departing from the scope and spirit of the invention. The clock out signal 40 may be further amplified by other inverter/amplifier circuits not shown in FIG. 6 for further driving other circuits.

FIG. 7 shows a graph of the behavior of some of the signals employed by the internal oscillator circuit 10. As shown in FIG. 7, the Vr signal 32 is shown to be at approximately 1 V when the oscillator enable signal is low (or '0') and, thereafter, when the oscillator enable signal goes high (or '1'), the Vr signal 32 fluctuates and finally stabilizes to a voltage level of approximately 1.7 V, 3.2 microseconds after the oscillator enable goes high. The clock out signal 40 is shown to be at a logic state of high (or 5 V) until approximately 3 microseconds after the oscillator enable signal goes high, then the clock out signal 40 starts to oscillate as expected. The oscillator enable 28 is shown to go from a low to a high state at 3 microseconds after start-up.

FIG. 8 shows an example application of the internal oscillator circuit in accordance with an embodiment of the present invention. In FIG. 8, a digital system 510 is shown employing the internal oscillator circuit 10, which receives the oscillator enable signal 28, the selection signals 24 and the Vcc signal 36 as input and generates the clock out signal 40, as described hereinabove, for use by a controller circuit 512. The controller circuit 512 programs the selection signals 24 through firmware code and uses the clock out signal 40 as the clock signal to drive many circuits within the circuit 512. The value of the selection signals 24 determines the frequency of the clock out signal 40. In the example provided in FIG. 8, the selection signals 24 are four bits and thus sixteen different frequencies may be generated at the clock out signal 40. The frequencies may be programmed to be in form of sixteen distinctively different frequencies or otherwise two or three frequencies may be programmed with the remaining frequencies being fine-tuning frequencies. Other forms of frequencies may be similarly programmed. Further, the more bits included in the selection signals 24, the more the number of frequencies that may be programmed.

While the invention has been particularly shown and described with reference to certain preferred embodiments, it will be understood by those skilled in the art that various alterations and modifications in form and detail may be made therein. Accordingly, it is intended that the following claims cover all such alterations and modifications as fall within the true spirit and scope of the invention.

What I claim is:

1. An oscillator circuit residing internally to a semiconductor device for generating a clock signal for use by digital circuits comprising:
    a voltage regulator circuit responsive to frequency selection signals for selecting a predetermined frequency, and a supply voltage signal, having a supply level voltage, the voltage regulator circuit operative to generate a voltage reference signal having a voltage reference level for adjusting to compensate for oscillator frequency fluctuations due to temperature, process and supply voltage variations; and
    a ring oscillator circuit responsive to said voltage reference signal for generating a clock out signal having a particular frequency based upon the voltage level of the voltage reference signal,
wherein the frequency of the clock out signal remains substantially constant despite temperature, process and supply voltage variations in the semiconductor circuit.

2. An oscillator circuit as recited in claim 1 further including a decoder circuit coupled to receive said frequency selection signals and operative to generate pull-up selection signals for use by said voltage regulator for determining the particular frequency of the clock out signal.

3. An oscillator circuit as recited in claim 2 wherein said frequency selection signals are programmable by the user for selectively determining the particular frequency and being configurable for changing the particular frequency to a selected frequency whereupon the frequency of the clock out signal is changed from the particular frequency to the selected frequency substantially smoothly.

4. An oscillator circuit as recited in claim 2 wherein said voltage regulator includes,
    a reference voltage generator circuit responsive to the supply voltage signal and a first voltage reference signal and operative to develop a second voltage reference signal;
    a voltage shifter circuit responsive to said second voltage reference signal and operative to develop a shifted voltage signal, the voltage shifter circuit for translating the range of the voltage level of the second voltage reference signal to that based upon the voltage level range of the supply voltage signal;
    a low pass filter circuit responsive to said shifted voltage signal and operative to develop a low pass filter output signal, the low pass filter circuit for preventing high frequency components coupled onto the shifted voltage signal from passing through to the first voltage reference signal; and
    a power generator circuit responsive to said low pass filter output signal and operative to develop said first voltage reference signal,
wherein the second voltage reference signal remains substantially constant despite fluctuations caused by temperature, process and supply voltage level in the first voltage reference signal thereby maintaining the frequency of the clock out signal substantially constant.

5. An oscillator circuit as recited in claim 3 wherein said voltage regulator circuit includes a plurality of pull-up transistors, each pull-up transistor corresponding to a unique particular frequency associated with the clock out signal and being controlled through one of said pull-up selection signals so that one of the pull-up transistors is caused to turn 'on' based upon the state of the frequency selection signals.

6. An oscillator circuit as recited in claim 5 wherein each of the pull-up transistors has a size associated therewith and the size of each of the pull-up transistors determines the selected frequency of the clock out signal.

7. An oscillator circuit as recited in claim 6 wherein each of the pull-up transistors is a p-channel transistor.

8. An oscillator circuit as recited in claim 1 further including a delay generator circuit responsive to an oscillator enable signal and being coupled to said voltage regulator circuit through a first delay signal and to said ring oscillator circuit through a second delay signal, said first delay signal for jump starting the voltage regulator circuit and said second delay signal for turning off the ring oscillator circuit during the voltage regulator recovery time.

9. An oscillator circuit as recited in claim 1 further including a voltage translator circuit responsive to a ring oscillator output voltage signal and operative to develop said clock out signal, said voltage translator circuit for translating the voltage level of the clock out signal from a voltage level range based upon said reference signal voltage level to a voltage level range based upon said supply voltage signal.

10. An oscillator circuit as recited in claim 1 wherein said ring oscillator circuit is further responsive to an oscillator enable signal for controlling the operation of the ring oscillator circuit wherein when the oscillator enable signal is deactivated, the clock output signal remains at a predetermined logic state and when the oscillator enable signal is activated, the clock output signal oscillates at a particular frequency.

11. A method for controlling the output of an oscillator circuit for generating a clock out signal for use by digital circuits comprising:
    generating a voltage reference signal having a voltage level in response to frequency selection signals for selecting a predetermined frequency;
    adjusting the voltage reference signal to compensate for variations in the oscillator circuit due to temperature, process and supply voltage variations; and in response to said voltage reference signal, generating a clock out signal having a particular frequency based upon the voltage level of the voltage reference signal, wherein the frequency of the clock out signal remains substantially constant despite temperature, process and supply voltage variations in the semiconductor circuit.

12. A method for controlling the output of an oscillator circuit as recited in claim 11 further comprising:

developing a first voltage reference signal and a second voltage reference signal in response to a supply voltage signal;

in response to said second voltage reference signal, developing a shifted voltage signal;

translating the range of the voltage level of the second voltage reference signal to a voltage level range based upon the voltage level range of the supply voltage signal;

in response to said shifted voltage signal, developing a low pass filter output signal;

preventing high frequency components coupled onto the shifted voltage signal from passing through to the first voltage reference signal; and in response to said low pass filter output signal, developing said first voltage reference signal, wherein the second voltage reference signal remains constant despite fluctuations caused by supply voltage level in the first voltage reference signal, yet the second voltage reference signal varies to compensate for temperature and process variations, thereby maintaining the frequency of the clock out signal substantially constant.

* * * * *